United States Patent
Kim et al.

(10) Patent No.: US 10,074,789 B2
(45) Date of Patent: Sep. 11, 2018

(54) THERMOELECTRIC MATERIAL AND METHOD FOR PREPARING THE SAME

(71) Applicants: Hyundai Motor Company, Seoul (KR); Kia Motors Corporation, Seoul (KR); Industry-Academic Cooperation Foundation, Yonsei University, Seoul (KR)

(72) Inventors: Byung Wook Kim, Seongnam-si (KR); Jong Kook Lee, Suwon-si (KR); Han Saem Lee, Seoul (KR); In Woong Lyo, Suwon-si (KR); Jin Woo Kwak, Gyeongsan-si (KR); Woo Young Lee, Seoul (KR); Gwan Sik Kim, Yongin-si (KR); Hwi Jong Lee, Seoul (KR)

(73) Assignees: Hyundai Motor Company, Seoul (KR); Kia Motors Corporation, Seoul (KR); Industry-Academic Cooperation Foundation,Yonsei University, Seoul (KR)

( * ) Notice: Subject to any disclaimer, the term of this patent is extended or adjusted under 35 U.S.C. 154(b) by 0 days.

(21) Appl. No.: 15/605,584

(22) Filed: May 25, 2017

(65) Prior Publication Data

US 2018/0175270 A1 Jun. 21, 2018

(30) Foreign Application Priority Data

Dec. 15, 2016 (KR) .................. 10-2016-0171732

(51) Int. Cl.
*H01L 35/22* (2006.01)
*H01L 35/16* (2006.01)
(Continued)

(52) U.S. Cl.
CPC ........ *H01L 35/16* (2013.01); *C04B 35/58085* (2013.01); *C04B 35/6261* (2013.01);
(Continued)

(58) Field of Classification Search
CPC ......... H01L 35/00; H01L 35/02; H01L 35/12; H01L 35/14; H01L 35/16; H01L 35/18;
(Continued)

(56) References Cited

U.S. PATENT DOCUMENTS

| 2010/0108115 A1* | 5/2010 | Lee ..................... H01L 35/16 136/236.1 |
| 2015/0069284 A1* | 3/2015 | Murai ................. H01L 35/26 252/62.3 T |
| 2015/0166348 A1* | 6/2015 | Ikenuma ............ C01B 31/0438 429/231.95 |

FOREIGN PATENT DOCUMENTS

| KR | 10-2013-0036638 A | 4/2013 |
| KR | 10-1330227 B1 | 11/2013 |

(Continued)

OTHER PUBLICATIONS

English machine translation of Woo et al. (WO 2016/076649), published on May 19, 2016.*

*Primary Examiner* — Christina Chern
(74) *Attorney, Agent, or Firm* — Morgan, Lewis & Bockius LLP

(57) ABSTRACT

Provided herein are a thermoelectric material and a method for preparing the same, wherein the thermoelectric material has excellent thermoelectric performance and high mechanical properties (in particular, fracture toughness), and thus, when the thermoelectric material is applied to a thermoelectric module, the thermoelectric module has excellent performance and efficiency and a long lifespan.

7 Claims, 3 Drawing Sheets

(51) Int. Cl.
| | |
|---|---|
| H01L 35/18 | (2006.01) |
| H01L 35/14 | (2006.01) |
| H01L 35/34 | (2006.01) |
| H01L 35/28 | (2006.01) |
| C04B 35/58 | (2006.01) |
| C04B 35/626 | (2006.01) |
| C04B 35/645 | (2006.01) |

(52) U.S. Cl.
CPC .... *C04B 35/6264* (2013.01); *C04B 35/62645* (2013.01); *C04B 35/645* (2013.01); *H01L 35/14* (2013.01); *H01L 35/18* (2013.01); *H01L 35/22* (2013.01); *H01L 35/28* (2013.01); *H01L 35/34* (2013.01); *C04B 2235/3891* (2013.01); *C04B 2235/422* (2013.01); *C04B 2235/5436* (2013.01); *C04B 2235/602* (2013.01); *C04B 2235/6567* (2013.01); *C04B 2235/6581* (2013.01); *C04B 2235/666* (2013.01); *C04B 2235/9607* (2013.01)

(58) Field of Classification Search
CPC ......... H01L 35/24; H01L 35/26; H01L 35/34; C04B 35/00; C04B 35/622; C04B 35/64; C04B 35/645; C04B 35/71; C04B 35/80; C04B 35/83
See application file for complete search history.

(56) References Cited

FOREIGN PATENT DOCUMENTS

| KR | 10-2015-0028513 A | 3/2015 | |
|---|---|---|---|
| KR | 10-2016-0056991 A | 5/2016 | |
| WO | WO 2016076649 A1 * | 5/2016 | ............. H01L 35/20 |

* cited by examiner

[Fig. 1]
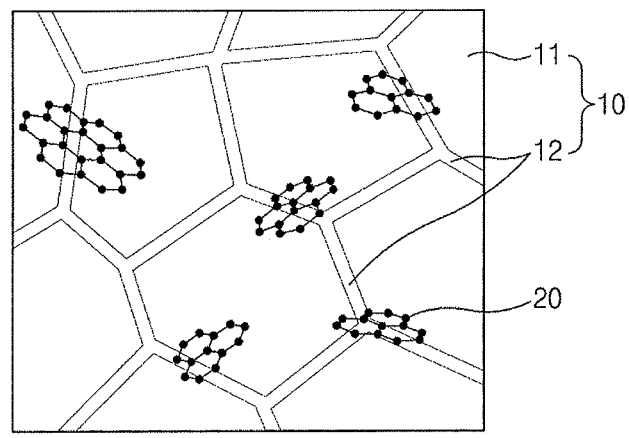
[Fig. 2]
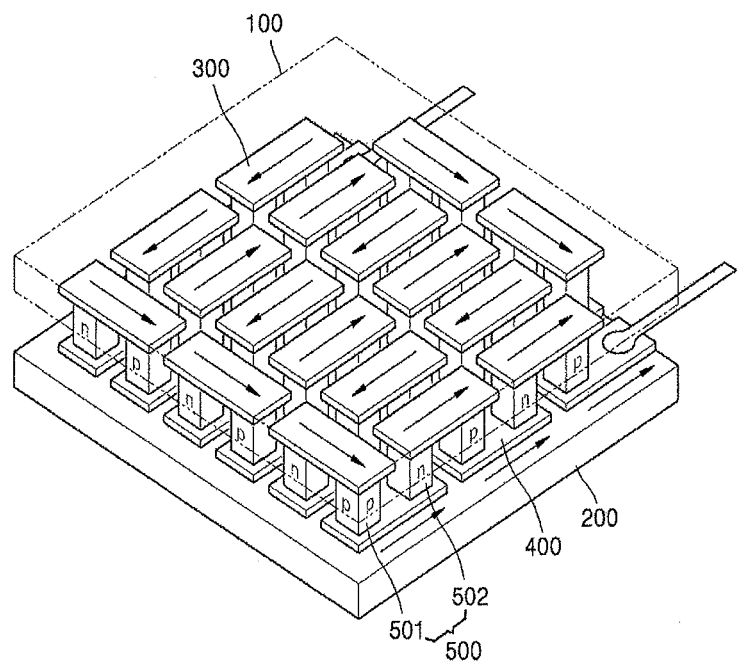

[Fig. 3]
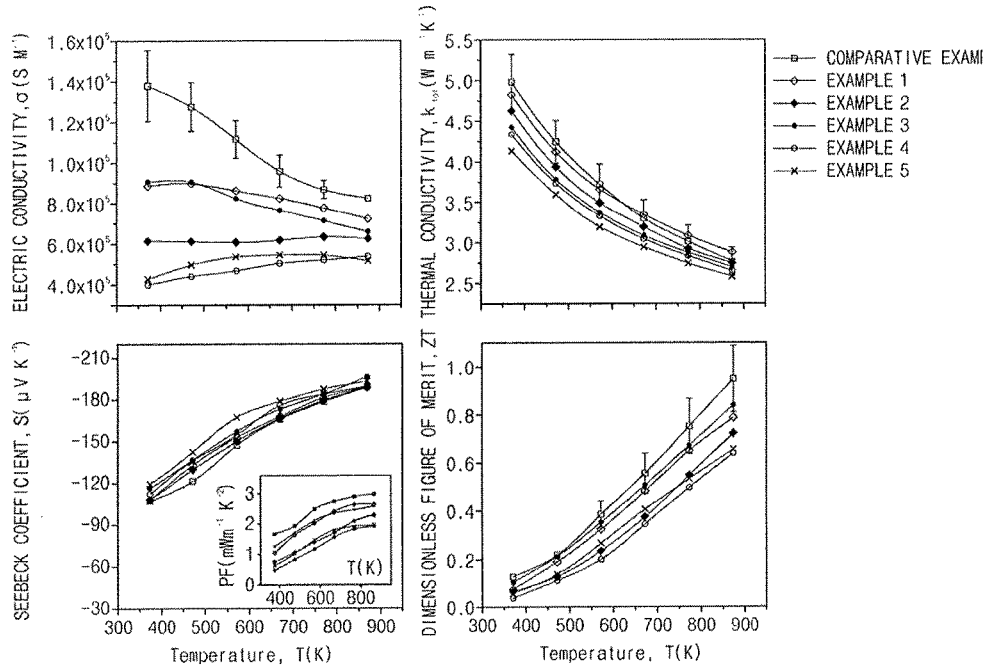
[Fig. 4]
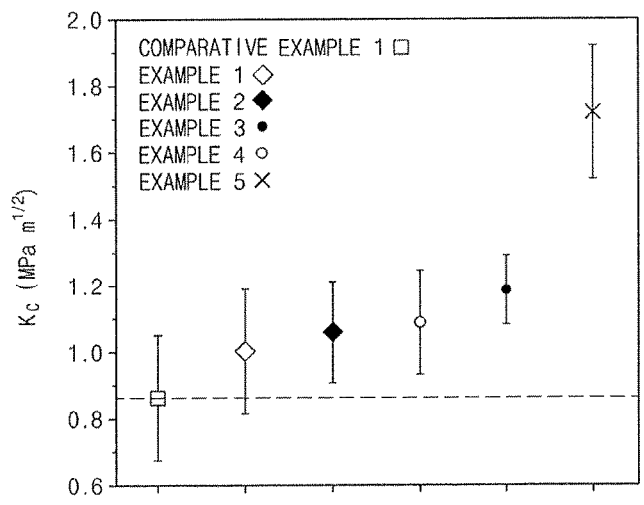

[Fig. 5]
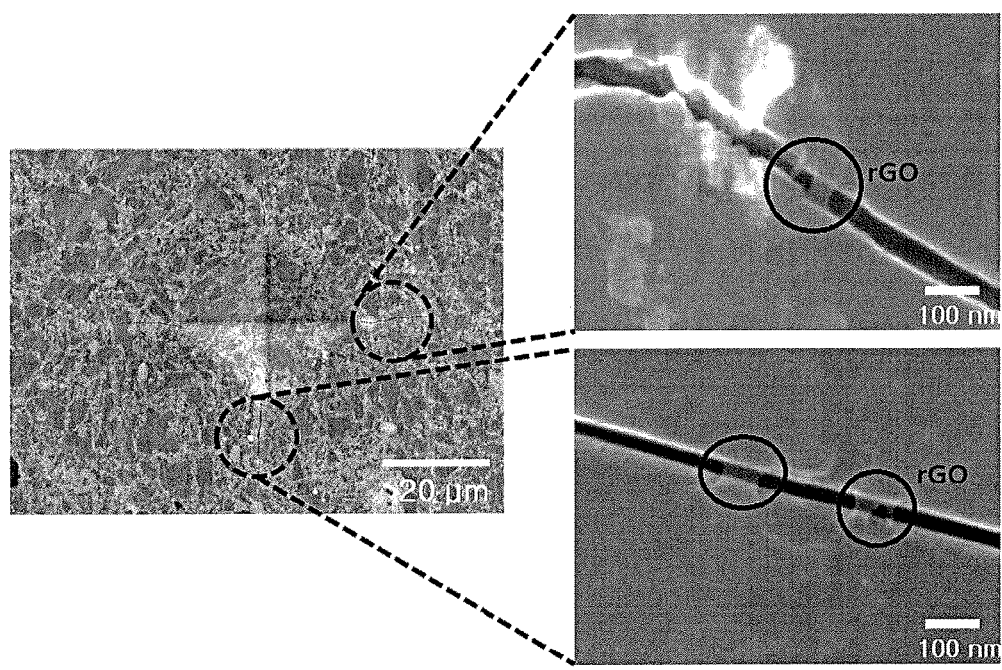

THERMOELECTRIC MATERIAL AND METHOD FOR PREPARING THE SAME

CROSS-REFERENCE TO RELATED APPLICATION

The present application claims priority to Korean Patent Application No. 10-2016-0171732, filed on Dec. 15, 2016, the entire contents of which is incorporated herein for all purposes by this reference.

BACKGROUND OF THE INVENTION

Field of the Invention

The present invention relates to a thermoelectric material with enhanced mechanical properties (e.g., fracture toughness) and a method for preparing the same.

Description of Related Art

A thermoelectric technology, such as directly converting thermal energy into electric energy or electric energy into thermal energy in a solid state, has been applied to thermoelectric generation to convert thermal energy into electric energy and thermoelectric cooling to convert electric energy into thermal energy. As a thermoelectric material used for thermoelectric generation and thermoelectric cooling has better thermoelectric performance, the performance of a thermoelectric module manufactured using the same may be enhanced.

Physical properties of a thermoelectric material determining thermoelectric performance include a thermoelectromotive force V, a Seebeck coefficient S, a peltier coefficient Π, a Thomson's coefficient τ a Nernst coefficient Q, an Ettingshausen coefficient P, electric conductivity σ, an output factor PF, a figure of merit Z, a dimensionless figure of merit $$\left(ZT = \frac{S^2\sigma}{\kappa}T \ (T: \text{absolute temperature})\right),$$

thermal conductivity κ, a Lorentz number L, electrical resistivity ρ, and the like. Among these physical properties, the dimensionless figure of merit ZT is an important physical property for determining thermoelectric conversion energy efficiency, and efficiency of generation and efficiency of generation and cooling may be enhanced by manufacturing a thermoelectric module using a thermoelectric material having a great value of the figure of merit $$\left(Z = \frac{S^2\sigma}{\kappa}\right).$$

That is, as a thermoelectric material has higher Seebeck coefficient and electric conductivity, and lower thermal conductivity, it has better thermoelectric performance.

According to workable temperatures, currently commercialized thermoelectric materials are classified as a Bi—Te-based thermoelectric material for a room temperature purpose, a Pb—Te-based thermoelectric material and a Mg—Si-based thermoelectric material for a middle temperature purpose, and a Fe—Si-based thermoelectric material for a high temperature purpose. However, these thermoelectric materials are mostly prepared by sintering metal powder, and thus, there is a limitation in obtaining a thermoelectric material having high mechanical properties. In particular, since the Mg—Si-based thermoelectric material is low in fracture toughness, relative to other thermoelectric materials, it cannot withstand but is broken by an impact applied in the process of repeatedly using a thermoelectric module to degrade lifespan of the thermoelectric module.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to providing a thermoelectric material having excellent thermoelectric performance and enhanced fracture toughness.

Various aspects of the present invention are directed to provide a method for preparing the thermoelectric material.

Various aspects of the present invention are directed to provide a thermoelectric element including the thermoelectric material.

Various aspects of the present invention are directed to provide a thermoelectric module including the thermoelectric element.

According to an exemplary embodiment of the present invention, a thermoelectric material may include a crystal structure composed of grains including a first element and a second element; and a planar material present in an interface within the crystal structure.

According to another exemplary embodiment of the present invention, a method for preparing a thermoelectric material may include (a) mixing first element powder and second element powder to obtain mixed powder; (b) mixing the mixed powder and a planar material to obtain a mixture; and (c) sintering the mixture.

According to another exemplary embodiment of the present invention, a thermoelectric element including the thermoelectric material is provided.

According to another exemplary embodiment of the present invention, a thermoelectric module may include an upper insulating substrate; a lower insulating substrate facing the upper insulating substrate; an upper electrode formed on the upper insulating substrate; a lower electrode formed on the lower insulating substrate; and the thermoelectric element in contact with each of the upper electrode and the lower electrode.

BRIEF DESCRIPTION OF THE DRAWINGS

FIG. 1 is a reference view illustrating a structure of a thermoelectric material of the present invention.

FIG. 2 is a perspective view illustrating a thermoelectric module of the present invention.

FIG. 3, FIG. 4, and FIG. 5 are reference views illustrating Experimental Examples 1 to 3 of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

In general, a thermoelectric material is prepared by sintering raw material powder, and thus, it may have a crystal structure including a grain formed as raw material powder particles are bonded (grown). Here, the crystal structure includes a plurality of grains and a grain boundary is present between the plurality of grains. When an impact is repeatedly applied to the thermoelectric material having such a crystal structure, the grain boundary between grains with a relatively weak bonding force may be cracked to degrade fracture toughness of the thermoelectric material.

Thus, in the present disclosure, in order to increase fracture toughness of the thermoelectric material, a planar material is introduced to an interface within the crystal structure which is largely cracked, and this will be described in detail with reference to the accompanying drawings.

Thermoelectric Material

Referring to FIG. 1, a thermoelectric material includes a crystal structure 10 and a planar material 20.

The crystal structure 10 included in the thermoelectric material includes grains 11 including a first element and a second element. That is, the crystal structure 10 of the present disclosure is a combination of a plurality of grains 11, and the first element and the second element are contained in the grain 11. A size of the grain 11 is not particularly limited and an average diameter (longer diameter) thereof is from about 100 to 5,000 nm (e.g., about 100 nm, 150, 200, 250, 300, 350, 400, 450, 500, 550, 600, 650, 700, 750, 800, 850, 900, 950, 1000, 1050, 1100, 1150, 1200, 1250, 1300, 1350, 1400, 1450, 1500, 1550, 1600, 1650, 1700, 1750, 1800, 1850, 1900, 1950, 2000, 2050, 2100, 2150, 2200, 2250, 2300, 2350, 2400, 2450, 2500, 2550, 2600, 2650, 2700, 2750, 2800, 2850, 2900, 2950, 3000, 3050, 3100, 3150, 3200, 3250, 3300, 3350, 3400, 3450, 3500, 3550, 3600, 3650, 3700, 3750, 3800, 3850, 3900, 3950, 4000, 4050, 4100, 4150, 4200, 4250, 4300, 4350, 4400, 4450, 4500, 4550, 4600, 4650, 4700, 4750, 4800, 4850, 4900, 4950, or about 5000 nm).

The first element may, but not limited thereto, be one or more selected from the group consisting of magnesium (Mg), bismuth (Bi), cobalt (Co), lead (Pb), zinc (Zn), silicon (Si), aluminum (Al), and manganese (Mn), and in some embodiments, is Mg. Also, the second element may, but not limited thereto, be one or more selected from the group consisting of silicon (Si), tellurium (Te), selenium (Se), stibium (Sb), and germanium (Ge), and in some embodiments, is Si.

The planar material 20 included in the thermoelectric material of the present disclosure is present in the interface within the crystal structure 10 (i.e., a grain boundary 12 between grains 11). Here, the planar material 20 may be present in a state of being coupled with the interface 12 within the crystal structure 10.

When the planar material 20 is present in the interface 12 within the crystal structure 10 in which cracking largely occurs, although linear cracking occur, progress in cracking may be effectively prevented due to the planar shape, and thus, the present disclosure may provide a thermoelectric material with enhanced fracture toughness.

Also, in a case where the planar material 20 having a composition different from that of the grain 11 is present in the interface 12 within the crystal structure 10, the incidence of phonon scattering is increased to act to increase overall thermal resistance of the thermoelectric material, whereby the present disclosure may provide a thermoelectric material with low thermal conductivity.

A thickness of the planar material 20 is preferably, but not limited to, about 1 to 3 nm (e.g., about 1 nm, about 2 nm, or about 3 nm). Also, a width and a length of the planar material 20 are, but not limited to, about 150 to about 1,000 nm, respectively. An aspect ratio of the planar material 20 may be about 100 to 1000 (e.g., about 100, 150, 200, 250, 300, 350, 400, 450, 500, 550, 600, 650, 700, 750, 800, 850, 900, 950, 1000) according to the thickness range and the range of the width and length. In detail, in the present disclosure, an aspect ratio (L/t) of the planar material 20 may be calculated by "(an average value (average length L) of the width and length of the planar material 20/thickness (t) of the planar material 20)".

When the thickness, width, and length of the planar material 20 are specified to the foregoing ranges, sizes of the planar material 20 and the grain 11 are comparable so that the planar material 20 may be stably positioned in the grain boundary between the grains 11 (i.e., in the interface 12 within the crystal structure 10) and an effect of preventing progress in cracking may be increased. If the planar material 20 is too small, relative to the grain 11, cracking may be difficult to prevent although the planar material 20 is positioned in the interface 12, and if the planar material 20 is too large, relative to the grain 11, the planar material 20 may be difficult to position in the interface 12.

Here, the ratio (L/d) of the average value (L) of the width and length of the planar material 20 to the diameter (d) of the grain 11 may, but not limited thereto, be from about 0.03 to 0.5 (e.g, about 0.03, 0.04, 0.05, 0.06, 0.07, 0.08, 0.09, 0.10, 0.11, 0.12, 0.13, 0.14, 0.15, 0.16, 0.17, 0.18, 0.19, 0.20, 0.21, 0.22, 0.23, 0.24, 0.25, 0.26, 0.27, 0.28, 0.29, 0.30, 0.31, 0.32, 0.33, 0.34, 0.35, 0.36, 0.37, 0.38, 0.39, 0.40, 0.41, 0.42, 0.43, 0.44, 0.45, 0.46, 0.47, 0.48, 0.49, or about 0.50). Also, the ratio (t/d) of the thickness (t) of the planar material 20 to the diameter (d) of the grain 11 may, but not limited thereto, be from about 0.0002 to 0.03 (e.g., about 0.0002, 0.0003, 0.0004, 0.0005, 0.0006, 0.0007, 0.0008, 0.0009, 0.001, 0.002, 0.003, 0.004, 0.005, 0.006, 0.007, 0.008, 0.009, 0.01, 0.02, or about 0.03).

The content of the planar material 20 may, but not limited thereto, be from about 0.1 to 10 vol % (e.g., about 0.1 vol %, 0.2, 0.3, 0.4, 0.5, 0.6, 0.7, 0.8, 0.9, 1, 2, 2.1, 2.2, 2.3, 2.4, 2.5, 2.6, 2.7, 2.8, 2.9, 3, 3.1, 3.2, 3.3, 3.4, 3.5, 3.6, 3.7, 3.8, 3.9, 4, 4.1, 4.2, 4.3, 4.4, 4.5, 4.6, 4.7, 4.8, 4.9, 5, 5.1, 5.2, 5.3, 5.4, 5.5, 5.6, 5.7, 5.8, 5.9, 6, 6.1, 6.2, 6.3, 6.4, 6.5, 6.6, 6.7, 6.8, 6.9, 7, 7.1, 7.2, 7.3, 7.4, 7.5, 7.6, 7.7, 7.8, 7.9, 8, 8.1, 8.2, 8.3, 8.4, 8.5, 8.6, 8.7, 8.8, 8.9, 9, 9.1, 9.2, 9.3, 9.4, 9.5, 9.6, 9.7, 9.8, 9.9, or about 10 vol %) with respect to a 100 vol % of the thermoelectric material. If the content of the planar material 20 is less than 0.1 vol %, it may be difficult to obtain an effect of enhancing fracture toughness of the thermoelectric material, and if the content of the planar material 20 exceeds 10 vol %, thermoelectric performance of the thermoelectric material may be degraded.

The planar material 20 may be graphene. Specifically, the planar material 20 may be a graphene oxide or a reduced graphene oxide, and in some cases, the reduced graphene oxide is more similar to graphene in physical properties.

As for the thermoelectric material of the present disclosure, one or more doping agents selected from the group consisting of bismuth (Bi), stibium (Sb), arsenic (As), phosphorus (P), tellurium (Te), selenium (Se), germanium (Ge), and aluminum (Al) may be further contained together with the first element and the second element.

The thermoelectric material of the present disclosure may be a Bi—Te-based, Pb—Te-based, Co—Sb-based, Mg—Si-based, Mn—Si-based, Fe—Si-based material, and the like, and in some instances, a Mg—Si-based material requiring further enhancement of fracture toughness.

Method for Preparing Thermoelectric Material

The present disclosure provides a method for preparing the aforementioned thermoelectric material, and details thereof will be described hereinafter.

a) Preparation of Mixed Powder

First element powder and second element powder are mixed to prepare mixed powder. The first element powder may, but not limited thereto, be powder formed of one or more elements (or metal, metalloid) selected from the group consisting of magnesium (Mg), bismuth (Bi), cobalt (Co), lead (Pb), zinc (Zn), silicon (Si), aluminum (Al), and manganese (Mn), and the second element powder may be powder formed of one or more elements (or metal, metalloid) selected from the group consisting of silicon (Si), tellurium (Te), selenium (Se), stibium (Sb), and germanium (Ge).

The first element powder and the second element powder may be mixed through a method known in the art. In detail, mixed powder having a particle diameter of 50 μm or less may be prepared through ball milling.

b) Preparation of Mixture

The mixed powder and a planar material are mixed to prepare a mixture. The planar material is the same as that described above in the part "Thermoelectric material."

The content of the planar material is, but not limited thereto, about 0.1 to 10 vol % with respect to 100 vol % of the thermoelectric material in consideration of physical properties of the thermoelectric material.

The mixed powder and the planar material may be mixed in a dry manner, and in some instances, in a wet manner by adding an organic solvent. Adding the organic solvent may prevent oxidation and contamination of the planar material and increase dispersibility of the mixed powder and the planar material. The organic solvent may be ethanol, acetone, toluene, or a mixture thereof, but any other organic solvent may also be used as long as it is known in the art.

c) Sintering

The mixture is introduced to a mold and sintered to prepare a thermoelectric material of the present disclosure. A method for sintering the mixture is not limited as long as it is known in the art and may be hot press, spark plasma sintering, and the like. Also, sintering conditions are not limited and, in consideration of density of the thermoelectric material, sintering may be performed at about 600° C. to 900° C. (e.g., about 600° C., 650° C., 700° C., 750° C., 800° C., 850° C., or about 900° C.) for about 3 minutes to 1 hour (e.g., about 3 minutes, 4, 5, 6, 7, 8, 9, 10, 15, 20, 25, 30, 35, 40, 45, 50, 55 minutes, or about 1 hour) at pressure of about 30 to 90 MPa (e.g., about 30 MPa, 35, 40, 45, 50, 55, 60, 65, 70, 75, 80, 85, or about 95 MPa).

Thermoelectric Element

The present disclosure provides a thermoelectric element including the thermoelectric material. In detail, the present disclosure provides a thermoelectric element having a predetermined shape (e.g., a rectangular parallelepiped) manufactured through a process of cutting and/or processing the aforementioned thermoelectric material, and the like.

The thermoelectric element may be a p-type thermoelectric element or an n-type thermoelectric element.

The thermoelectric element may be coupled to an electrode so as to be modularized and applied to a thermoelectric cooling system capable of exhibiting a cooling effect by applying a current or a thermoelectric generation system capable of exhibiting a power generation effect based on a temperature difference.

Thermoelectric Module

The present disclosure provides a thermoelectric module including the thermoelectric element, and details thereof will be described with reference to FIG. 2.

The thermoelectric module of the present disclosure includes an upper insulating substrate 100, a lower insulating substrate 200, an upper electrode 300, a lower electrode 400, and a thermoelectric element 500.

The upper insulating substrate 100 and the lower insulating substrate 200 included in the thermoelectric module of the present disclosure are spaced apart from each other at a predetermined interval in a facing manner, on which the electrodes 300 and 400 are respectively formed. Materials forming the insulating substrates 100 and 200 may, but not limited thereto, be gallium arsenide (GaAs), sapphire, silicon, pyrex, quartz, and the like.

The upper electrode 300 and the lower electrode 400 included in the thermoelectric module of the present disclosure may be formed through a process of patterning on the upper insulating substrate 100 and the lower insulating substrate 200. Here, the patterning method may, but not limited thereto, be lift-off, deposition, photolithography, and the like. Materials forming the upper electrode 300 and the lower electrode 400 may, but not limited thereto, be aluminum, nickel, gold, titanium, and the like.

The thermoelectric element 500 included in the thermoelectric module of the present disclosure is formed of the foregoing thermoelectric material and may include a p-type thermoelectric element 501 and an n-type thermoelectric element 502 respectively in contact with the upper electrode 300 and the lower electrode 400.

Since the thermoelectric module of the present disclosure includes the thermoelectric element 500 formed of a thermoelectric material having excellent thermoelectric performance and high fracture toughness, it may exhibit excellent performance and efficiency and long lifespan. In particular, since the thermoelectric module of the present disclosure has excellent durability, it may be advantageously used in a vehicle component (e.g., an engine).

Hereinafter, examples of the present disclosure will be described in detail. However, the examples merely exemplify the present disclosure and the present disclosure is not limited by the examples.

Example 1

Raw material powder obtained by mixing 58.44 g of Mg powder (first element powder), 32.76 g of Si powder (second element powder), 7.50 g of Bi powder, and 1.30 g of Al powder was heat-treated in a vacuum state. Here, the heat treatment was performed such that Al was doped to a Mg-site, Bi was doped to a Si-site, and the doped Mg and doped Si formed a $Mg_2Si$ phase. The heat-treated raw material powder was ball-milled for five minutes (SPEX, 8000 D) to prepare 100 g of mixture powder having a composition of $Mg_{1.96}Al_{0.04}Si_{0.97}Bi_{0.03}$ and having a particle diameter of 50 µm or less.

Thereafter, a graphene oxide (thickness: 1 to 20 nm, aspect ratio: 10 to 5,000) was mixed to the prepared mixture powder to prepare a mixture such that the graphene oxide occupies 1 vol % of a total volume of a finally prepared thermoelectric material.

Thereafter, the prepared mixture was introduced to a mold and spark-plasma-sintered to prepare a thermoelectric material. The spark plasma sintering was performed in a vacuum state, and here, a sintering temperature was about 750° C., sintering pressure was 40 MPa, and a sintering time duration was 5 minutes.

Example 2

A thermoelectric material was prepared through the same process as that of Example 1, except that a graphene oxide was mixed to occupy 3 vol % of the total volume of the finally prepared thermoelectric material.

Example 3

A thermoelectric material was prepared through the same process as that of Example 2, except that a reduced graphene oxide (thickness: 1 to 20 nm, aspect ratio: 10 to 5,000), instead of a graphene oxide, was applied.

Example 4

Raw material powder obtained by mixing 58.44 g of Mg powder (first element powder), 32.76 g of Si powder (second element powder), 7.50 g of Bi powder, and 1.30 g of Al powder was heat-treated in a vacuum state. Here, the heat treatment was performed such that Al was doped to a Mg-site, Bi was doped to a Si-site, and the doped Mg and doped Si formed a $Mg_2Si$ phase. The heat-treated raw material powder was ball-milled for five minutes (SPEX, 8000 D) to prepare 100 g of mixture powder having a composition of $Mg_{1.96}Al_{0.04}Si_{0.97}Bi_{0.03}$ and having a particle diameter of 50 µm or less.

Thereafter, a graphene oxide (thickness: 1 to 20 nm, aspect ratio: 10 to 5,000) was mixed to the prepared mixture powder such that the graphene oxide occupies 3 vol % of a total volume of a finally prepared thermoelectric material, and ethanol was added to prepare a mixture in a slurry state.

Thereafter, the prepared mixture was introduced to a mold and spark-plasma-sintered to prepare a thermoelectric material. The spark plasma sintering was performed in a vacuum state, and here, a sintering temperature was about 750° C. was introduced to a mold and spark-plasma-sintered to prepare a they minutes.

Example 5

A thermoelectric material was prepared through the same process as that of Example 4, except that a reduced graphene oxide (thickness: 1 to 20 nm, aspect ratio: 10 to 5,000), instead of a graphene oxide, was applied.

Comparative Example 1

Raw material powder obtained by mixing 58.44 g of Mg powder (first element powder), 32.76 g of Si powder (second element powder), 7.50 g of Bi powder, and 1.30 g of Al powder was heat-treated in a vacuum state. Here, the heat treatment was performed such that Al was doped to a Mg-site, Bi was doped to a Si-site, and the doped Mg and doped Si formed a $Mg_2Si$ phase. The heat-treated raw material powder was ball-milled for five minutes (SPEX, 8000 D) to prepare 100 g of mixture powder having a composition of $Mg_{1.96}Al_{0.04}Si_{0.97}Bi_{0.03}$ and having a particle diameter of 50 µm or less.

Thereafter, the prepared mixture was introduced to a mold and spark-plasma-sintered to prepare a thermoelectric material. The spark plasma sintering was performed in a vacuum state, and here, a sintering temperature was about 750° C., sintering pressure was 40 MPa, and a sintering time duration was 5 minutes.

Experimental Example 1

Evaluation of Thermoelectric Performance

Physical properties of the thermoelectric materials respectively prepared in Examples 1 to 5 and Comparative Example 1 were evaluated as follows and results thereof are illustrated in FIG. 3.

Electric conductivity: It was measured by a four point method.

Seebeck coefficient: It was measured using Ulvac ZEM-3 equipment.

Thermal conductivity: It was measured by LFA (Laser Flash Analysis).

Dimensionless figure of merit (ZT): It was calculated by applying Equation 1 below.

$$ZT = \frac{S^2 \sigma}{\kappa} T \qquad \text{[Equation 1]}$$

wherein S denotes Seebeck coefficient, σ denotes Electric conductivity, κ denotes Thermal conductivity, and T denotes Absolute temperature.

Referring to FIG. 3, it can be seen that Examples 1 to 5 corresponding to a thermoelectric material of the present disclosure have thermoelectric performance equal to or higher than that of Comparative Example 1.

Experimental Example 2

Evaluation of Fracture Toughness ($K_c$)

A pyramidal indenter was pressed to the thermoelectric materials respectively prepared in Examples 1 to 5 and Comparative Example 1 by a force of 2.942 N to cause cracks in the thermoelectric materials. Thereafter, fracture toughness was evaluated on the basis of Equation 2 below and results thereof are illustrated in FIG. 4.

$$K_C = \alpha \left(\frac{E}{H}\right)^{0.5} \times \frac{P}{C^{1.5}} \qquad \text{[Equation 2]}$$

wherein P denotes an applied load, E denotes a Young's modulus, H denotes a Vickers hardness, c denotes a radial crack length, and reafter, fracture toughness was Referring to FIG. 4, it can be seen that Examples 1 to 5 corresponding to the thermoelectric material of the present disclosure have improved fracture toughness, compared with Comparative Example 1. In particular, it can be seen that fracture toughness of Example 5 is better by two or more times than that of Comparative Example 1.

Experimental Example 3

Verification of Planar Material

A surface of the thermoelectric material of Example 5 to which the evaluation of fracture toughness was applied was checked by a scanning electron microscope (SEM), and results thereof are illustrated in FIG. 5.

Referring to FIG. 5, it can be seen that a reduced graphene oxide (a planar material) is positioned in a path of cracking. In general, cracking occurs along an interface (between grains) of a crystal structure, and the fact that the reduced graphene oxide is positioned in the path of cracking supports that the planar material of the present disclosure is positioned in the interface within the crystal structure.

As described above, since the thermoelectric material has the conductive planar material capable of preventing a progress of cracking in the interface within the crystal structure where cracking largely occurs, the thermoelectric material of the present disclosure has low thermal conductivity and high electric conductivity and fracture toughness. Thus, when the thermoelectric module is manufactured using the thermoelectric material of the present disclosure, the thermoelectric module may have excellent performance and efficiency and long lifespan.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A method for preparing a thermoelectric material, the method comprising:
    (a) mixing first element powder and second element powder to obtain mixed powder,
    wherein the first element powder is selected from the group consisting of magnesium (Mg), bismuth (Bi), cobalt (Co), lead (Pb), silicon (Si), zinc (Zn), aluminum (Al), and manganese (Mn) and the second element powder is selected from the group consisting of silicon (Si), tellurium (Te), selenium (Se), stibium (Sb), and germanium (Ge);
    (b) mixing the mixed powder and a planar material to obtain a mixture, wherein the planar material is graphene; and
    (c) sintering the mixture,
    wherein, in step (c), the mixture is sintered at 600° C. to 900° C. for about 3 minutes to 1 hour under pressure of about 30 to 90 MPa.

2. The method according to claim 1, wherein an organic solvent is added in step (b).

3. The method according to claim 2, wherein the organic solvent is one or more selected from the group consisting of ethanol, acetone, and toluene.

4. The method according to claim 1, wherein the planar material is a reduced graphene oxide.

5. The method according to claim 1, wherein a thickness of the planar material is about 1 to 20 nm.

6. The method according to claim 1, wherein an aspect ratio of the planar material is about 10 to 5,000.

7. The method according to claim 1, wherein a content of the planar material is about 0.1 to 10 vol % with respect to 100 vol % of the thermoelectric material.

* * * * *